(12) United States Patent
Yu et al.

(10) Patent No.: US 7,920,413 B2
(45) Date of Patent: Apr. 5, 2011

(54) APPARATUS AND METHOD FOR WRITING DATA TO PHASE-CHANGE MEMORY BY USING POWER CALCULATION AND DATA INVERSION

(75) Inventors: Byoung-Gon Yu, Daejeon (KR); Byung-Do Yang, Cheongju (KR); Seung-Yun Lee, Daejeon (KR); Sung-Min Yoon, Daejeon (KR); Young Sam Park, Daejeon (KR); Nam Yeal Lee, Daejeon (KR)

(73) Assignees: Electronics & Telecommunications Research Institute, Daejeon (KR); Cungbuk Nat'l Univ. Industry Academic Cooperation Foundation, Cheongju (KR)

( * ) Notice: Subject to any disclaimer, the term of this patent is extended or adjusted under 35 U.S.C. 154(b) by 491 days.

(21) Appl. No.: 12/040,137

(22) Filed: Feb. 29, 2008

(65) Prior Publication Data

US 2008/0219047 A1    Sep. 11, 2008

(30) Foreign Application Priority Data

Mar. 6, 2007  (KR) .......................... 10-2007-0021967

(51) Int. Cl.
*G11C 11/00* (2006.01)
(52) U.S. Cl. .............. 365/163; 365/189.16; 365/189.07; 365/190
(58) Field of Classification Search .................. 365/163, 365/189.011, 189.16 X, 189.07 X, 190 X, 365/189.16, 189.07, 190
See application file for complete search history.

(56) References Cited

U.S. PATENT DOCUMENTS 6,999,371 B2 * 2/2006 Nii ................................ 365/227

(Continued)

FOREIGN PATENT DOCUMENTS

KR  10-2000-0007798   2/2000

(Continued)

OTHER PUBLICATIONS

Byung-Rok Oh, et al., "Enhanced Write Performance of a 64-Mb Phase-Change Random Access Memory", IEEE Journal of Solid-State Circuits, vol. 41, No. 1, Jan. 2006, pp. 122-126.
Woo Yeong Cho, et al., "A 0.18-um 3.0-V 64-Mb Nonvolatile Phase-Transition Random Access Memory (PRAM)", IEEE Journal of Solid State Circuits, vol. 40, No. 1, Jan. 2005, pp. 293-300.

*Primary Examiner* — VanThu Nguyen
(74) *Attorney, Agent, or Firm* — Kile Park Goekjian Reed & McManus PLLC

(57) ABSTRACT

Provided are an apparatus and method for writing data to a phase-change random access memory (PRAM) by using writing power calculation and data inversion functions, and more particularly, an apparatus and method for writing data which can minimize power consumption by calculating the power consumed while input original data or inverted data is written to a PRAM and storing the data consuming less power. A PRAM consumes a significant amount of power in order to store data in a memory cell since a large electric current is required to flow for a long period of time. According to the present invention, since the PRAM consumes different amounts of power when writing data with a value of 0 and data with a value of 1, the power consumed when input original data is stored and the power consumed when the input original data is inverted and stored are compared to each other, the data with a smaller power consumption is stored when the data is written to the PRAM as a word unit, and thus the power consumption of the PRAM can be reduced.

15 Claims, 6 Drawing Sheets

U.S. PATENT DOCUMENTS

| | | | | |
|---|---|---|---|---|
| 7,106,621 B2* | 9/2006 | Frey | | 365/158 |
| 7,170,812 B2* | 1/2007 | Nii | | 365/227 |
| 7,242,605 B2* | 7/2007 | Choi et al. | | 365/148 |
| 7,391,643 B2* | 6/2008 | Fuji | | 365/163 |
| 7,525,864 B2* | 4/2009 | Brown | | 365/227 |
| 2006/0242495 A1 | 10/2006 | Choi | | |

FOREIGN PATENT DOCUMENTS

| KR | 10-2005-0051135 | 6/2005 |
|---|---|---|
| KR | 10-2006-0082510 | 7/2006 |

* cited by examiner

APPARATUS AND METHOD FOR WRITING DATA TO PHASE-CHANGE MEMORY BY USING POWER CALCULATION AND DATA INVERSION

CROSS-REFERENCE TO RELATED PATENT APPLICATIONS

This application claims the priority of Korean Patent Application No. 10-2007-0021967, filed on Mar. 6, 2007, in the Korean Intellectual Property Office, the disclosure of which is incorporated herein in its entirety by reference.

BACKGROUND OF THE INVENTION

1. Field of the Invention

The present invention relates to an apparatus and method for writing data to a phase-change random access memory (PRAM) by using writing power calculation and data inversion functions, and more particularly, to an apparatus and method for writing data which can minimize power consumption by calculating the power consumed while input original data or inverted data is written to a PRAM and storing the data that consumes less power.

This work was supported by the IT R&D program of MIC/IITA.[2005-S-072-02, Technology of a nano scale phase change data storage]

2. Description of the Related Art

A phase-change random access memory (PRAM) is a memory using a GST ($Ge_2Sb_2Te_5$) material which has two different resistances according to the status of a memory cell. The PRAM should be in a set state which has low resistance in order to store data of "0" in the PRAM, and in order to put the PRAM in a set state, a set current pulse which enables set current to flow for a set period of time should be supplied to a phase change memory cell.

On the other hand, to store data of "1" in the PRAM, the PRAM should be in a reset state which has high resistance, and in order to put the PRAM in the reset state, a reset current pulse which enables reset current to flow for a reset period of time should be supplied to a phase change memory cell.

For a writing process to store data in the memory cell, the PRAM consumes a substantial amount of power since a large electric current flows through a phase change memory cell for a long period of time. On the other hand, a data reading process needs a small electric current which flows for a short period of time through a phase change memory cell, and therefore the power consumption for reading data is relatively smaller than that for writing data.

In the conventional art, the PRAM always performs the data writing process regardless of the value of the data stored in a memory cell. Also when the data is stored, data comprising several bits is stored in the PRAM as a word unit. Such a method of storing data is not efficient since the same bits may be repeatedly written, and thus the writing power may be unnecessarily consumed for writing data redundantly.

SUMMARY OF THE INVENTION

The present invention provides an apparatus and method for writing data to a phase-change random access memory (PRAM) by using writing power calculation and data inversion functions. The apparatus and method allow data with a smaller writing power consumption to be stored in the PRAM by comparing writing power consumption values of when input original data is stored intact and of when the input original data is inverted and stored, so that the power consumption for writing data to the PRAM can be reduced. The power consumed when the input original data is stored intact as a word unit is compared with the power consumed when the input original data is inverted and stored, and then the data with the smaller power consumption is stored in the PRAM, and accordingly less power can be consumed compared to when the input original data is stored intact regardless of a value of existing data.

According to an aspect of the present invention, there is provided an apparatus for writing data to a phase-change random access memory (PRAM) by using writing power calculation and data inversion functions, the apparatus comprising: a receiving unit which receives original data to be written to a memory cell of the PRAM; a reading unit which reads data existing in the memory cell; an original data writing power calculating unit which compares the received original data with the read existing data by the bit and calculates a total power consumption value for writing bits of the original data which are different from those of the existing data, based on a power consumption value corresponding to each bit value of the PRAM; an inverted data writing power calculating unit which inverts the received original data by the bit, compares the inverted data with the existing data by the bit, and calculates a total power consumption value for writing bits of the inverted data which are different from those of the existing data based on the power consumption value corresponding to each bit value of the PRAM; and a writing unit which compares the total power consumption value for the original data with the total power consumption value for the inverted data and chooses the data which has a smaller power consumption value between the original data and the inverted data, and stores the chosen data in the memory cell.

According to another aspect of the present invention, there is provided a method of writing data to a PRAM by using writing power calculation and data inversion functions, the method comprising: receiving data to be written to a memory cell of the PRAM; receiving original data to be written to a memory cell of the PRAM; reading existing data from the memory cell; calculating a total power consumption value for writing bits of the original data which are different from those of the existing data based on a power consumption value corresponding to each bit value of the PRAM after comparing the received original data with the read existing data by the bit; inverting the received original data by the bit; calculating a total power consumption value for writing bits of the inverted data which are different from those of the existing data based on a power consumption value corresponding to each bit value in the PRAM after comparing the inverted data with the existing data by the bit; comparing the total power consumption value for the original data with the total power consumption value for the inverted data; and choosing the data which has a smaller total power consumption and storing the chosen data in the memory cell.

According to yet another aspect of the present invention, there is provided an apparatus for writing data to a PRAM by using writing power calculation and data inversion functions; the apparatus comprising: an original data generating unit which receives data of n bits to be written to a memory cell in the PRAM and generates an original data by adding an additional bit to the received data of n bits; an inverted data generating unit which generates inverted data by inverting the generated original data by the bit; an existing data reading unit which reads existing data of n+1 bits from the memory cell; a bit comparing unit which compares the read data of n+1 bits respectively with the original data and the inverted data by the bit to check whether there are different bits between the read data and the original data and the inverted data, and if so, the bit comparing unit checks types and number of the different bits; a power consumption calculating unit which calculates respectively each total power consumption value for the original data and the inverted data by using the number of different bits and writing power consumption values respectively corresponding to the types of the different bits when the comparison result shows that there are different bits; and a data writing unit which chooses the data which has a smaller power consumption between the original data and the inverted data, and stores parts of the chosen data which are different from those of the existing data.

According to still another aspect of the present invention, there is provided a method of writing data to a PRAM by using writing power calculation and data inversion functions, the method comprising: receiving data of n bits to be written to a memory cell in the PRAM and generating an original data by adding an additional bit to the received data of n bits; generating inverted data by inverting the original data by the bit; reading existing data of n+1 bits from the memory cell; comparing the read data of n+1 bits respectively with the original data and the inverted data by the bit and checking whether there are different bits between the read data and the original data and the inverted data, and if so, checking types and number of the different bits; calculating respectively each total power consumption value for the original data and the inverted data by using the number of different bits and writing power consumption values respectively corresponding to the types of the different bits when the comparison result shows that there are different bits; and choosing the data which has a smaller power consumption between the original data and the inverted data, and storing parts of the chosen data which are different from those of the existing data.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
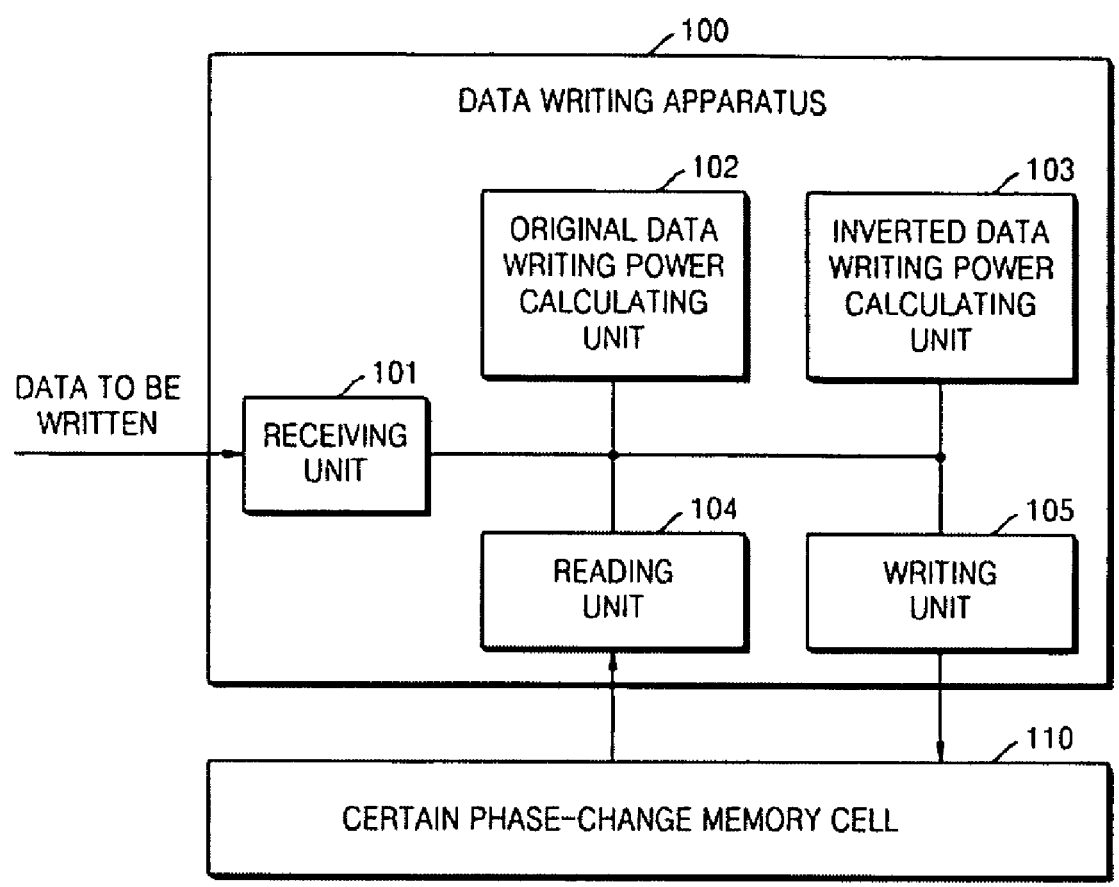
FIG. 1 is a block diagram of a data writing apparatus of a phase-change random access memory (PRAM), which uses functions of writing power consumption calculation and data inversion, according to an embodiment of the present invention.

FIG. 1 is a block diagram of a data writing apparatus 100 of a phase change random access memory (PRAM), which uses functions of writing power consumption calculation and data inversion, according to an embodiment of the present invention.

Referring to FIG. 1, the data writing apparatus 100 includes a receiving unit 101, a reading unit 104, an original data power calculating unit 102, an inverted data power calculating unit 103, and a writing unit 105.

The receiving unit 101 receives original data to be written to a phase-change memory cell 110 of a phase-change random access memory (PRAM).

The reading unit 104, reads existing data from a memory cell 110 on which the input original data is to be written.

The original data writing power calculating unit 102 compares, by the bit, the input original data with the existing data read from the memory cell by the bit and calculates the total power consumption value for writing bits of the input original data that is different from the existing data. In this case, the power consumption value is calculated based on power consumption values corresponding to respective bit values of the PRAM, which are power values used to set or reset each bit in the phase-change memory cell 110.

The inverted data writing power calculating unit 103 inverts the input original data by the bit, compares, by the bit, the inverted data with the existing data, and calculates the total power consumption value for writing bits of the inverted data, which is different from the existing data based on the power consumption values, corresponding to respective bit values of the PRAM.

The writing unit 105 compares the total power consumption value for the input original data, calculated by the original data writing power calculating unit 102, with the total power consumption value for the inverted data, calculated by the inverted data writing power calculating unit 103, and stores a smaller power consumption value in the memory cell 110 to which the input original data is to be written. The writing unit 105 may be implemented to store only the bits that are different from those of the existing data when writing data of the smaller power consumption value to the memory cell 110.

Figure 2:
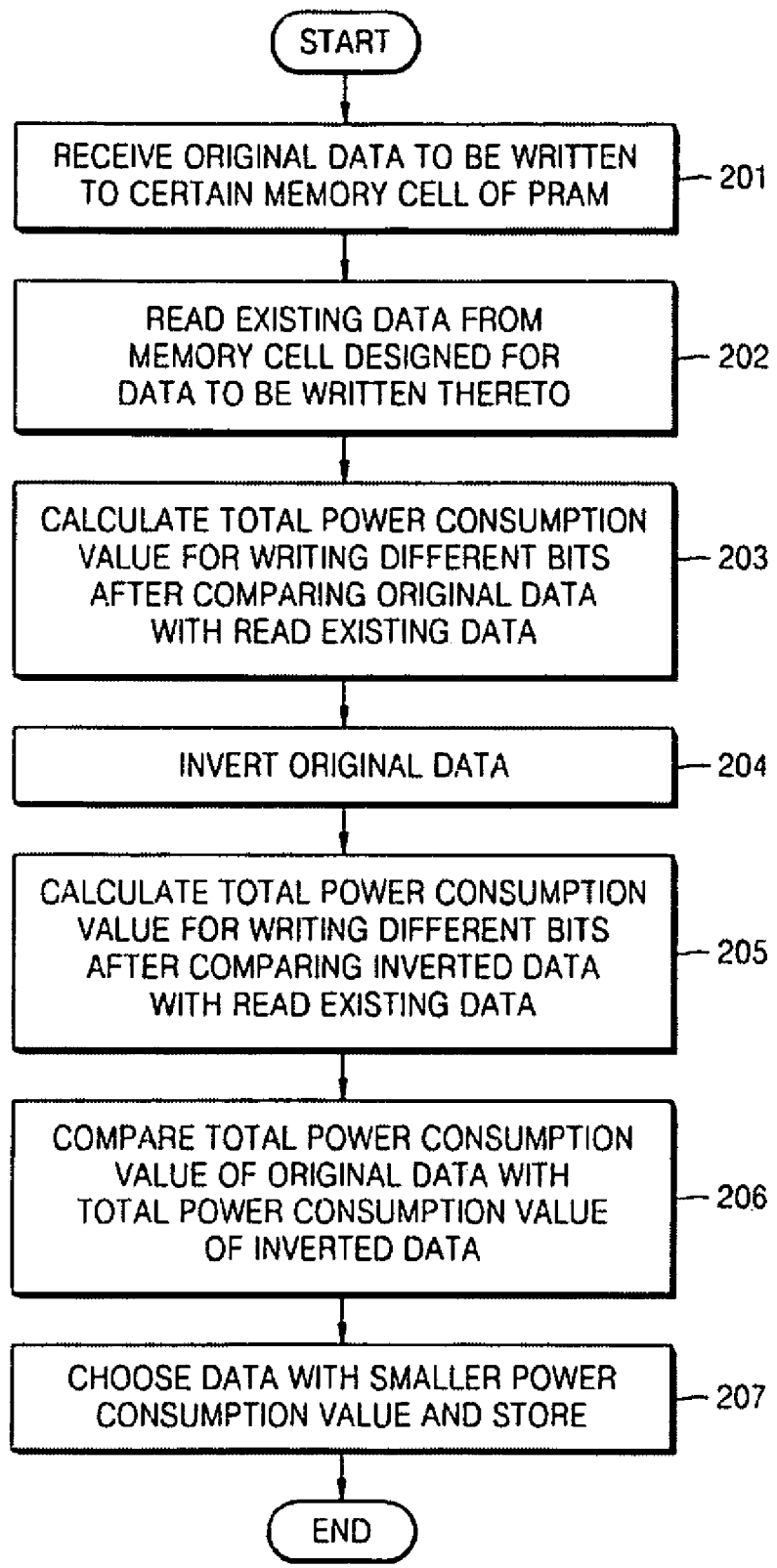
FIG. 2 is a flowchart illustrating a method of writing data to a PRAM by calculating writing power consumption and inverting data, according to an embodiment of the present invention.

FIG. 2 is a flowchart illustrating a method of writing data to a PRAM by calculating writing power consumption and inverting data, according to an embodiment of the present invention. Referring to FIG. 2, original data to be written to a memory cell of the PRAM is input (201). The existing data is read from the memory cell to which the input original data is to be written (202).

The input original data and the existing data are compared by the bit to calculate the total power consumption value for writing the bits that are different from those of the existing data (203).

The input original data is inverted (204), and then the inverted data and the existing data are compared by the bit to calculate the total power consumption value for writing the bits that are different from those of the existing data (205). Since there is no specific order for calculating the total power consumption value, the total power consumption value for writing the bits of the inverted data can be calculated prior to calculating the total power consumption value for writing the bits of the input original data. The total power consumption value is calculated based on power consumption values corresponding to respect data values, and the power consumption values corresponding to the respect data values of the PRAM indicate the power values required to set or reset each bit of the memory cell of the PRAM.

The calculated total power consumption value for the input original data and the calculated total power consumption value for the inverted data are compared (206).

The data which has a smaller total power consumption is chosen, and the chosen data is stored in the memory cell (207). In the present embodiment, the different bits are bits from among the bits of the input original data or the inverted data which are different from the corresponding bits of the existing data read from the memory cell.

Figure 3:
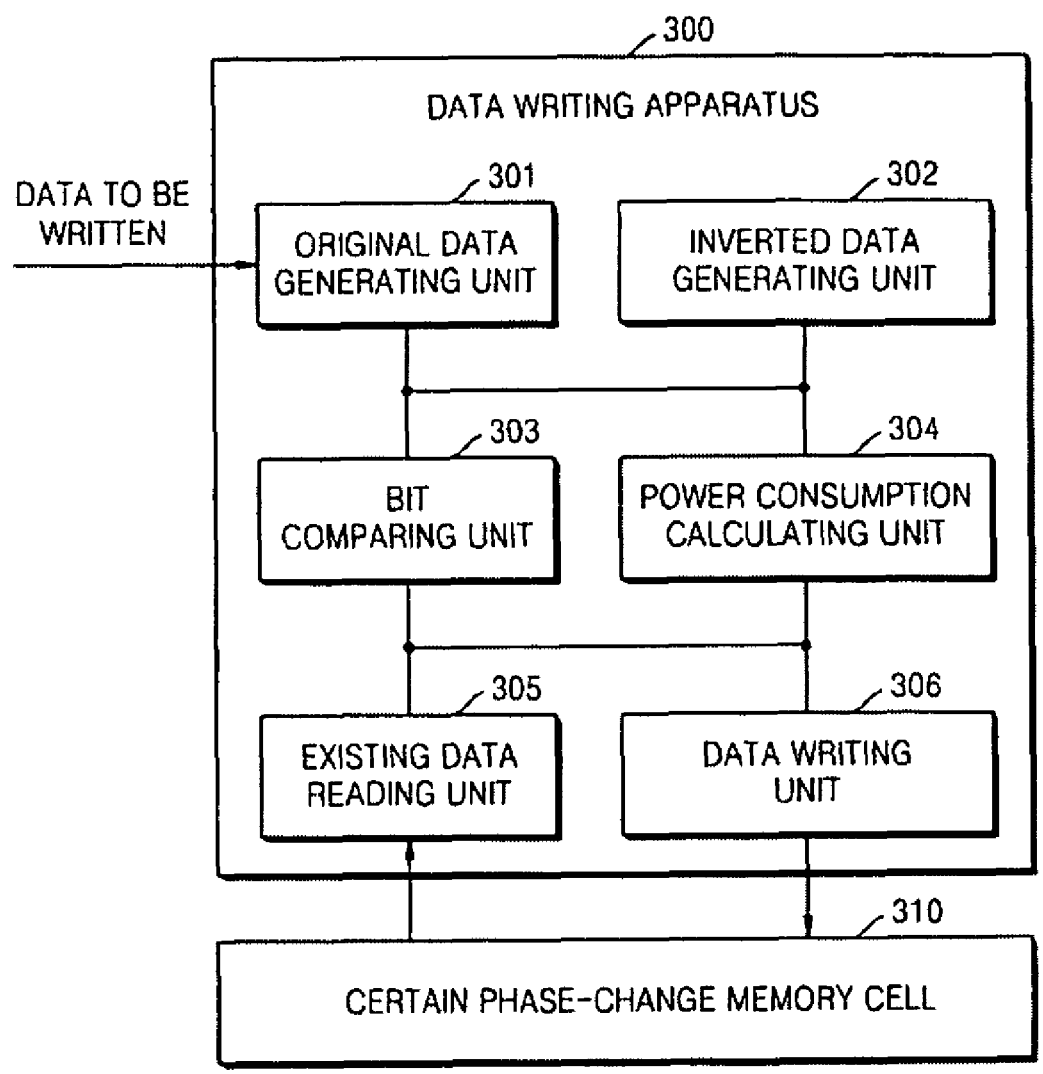
FIG. 3 is a schematic block diagram of a data writing apparatus in a PRAM, in conjunction with data flow, according to an embodiment of the present invention.

FIG. 3 is a block diagram of a data writing apparatus in a PRAM, in conjunction with data flow, according to an embodiment of the present invention.

FIG. 3 shows a different construction of the data writing apparatus in FIG. 1 in terms of data flow.

Referring to FIG. 3, the data writing apparatus in a PRAM includes an original data generating unit 310, an inverted data generating unit 302, and an existing data reading unit 305.

The original data generating unit 301 generates original data by receiving data to be written to a certain memory cell 310 and adding bits to the received data.

The received data is n bits and existing data read from the memory cell 310 is n+1 bits. The additional bit added to the original data, which indicates that the original data is not inverted data, differentiates the original data from inverted data.

The inverted data generating unit 302 generates inverted data by inverting the original data by the bit.

The existing data reading unit 305 reads existing data from the memory cell 310 to which the input original data is to be written.

The data writing apparatus in a PRAM further includes a bit comparing unit 303 and a power consumption calculating unit 304.

The bit comparing unit 303 compares bits of the read data respectively with bits of the original data and the inverted data and checks if the original data and the inverted data have different bits from those of the read data, and if they do, determines types of the bits, and the number of the bits.

The bit comparing unit 303 does not need to compare the additional bit of the original data and the inverted bit of the inverted data which is generated by inverting the additional bit of the original bit with the n+1th bit of the existing data. This is because the additional bit and the inverted bit are only for indicating the original data and the inverted data.

The types of the different bits are determined by bit values including reset and set. The different bit values cause different power consumption.

When there are a plurality of different bits each of which has a bit value of set or reset, the total value of writing power consumption is calculated by adding results obtained by multiplying a writing power consumption value corresponding to each bit type (set or reset) by the number of the different bits of a corresponding bit type.

The power consumption calculating unit 304 calculates a total power consumption value for each of the original data and the inverted data.

The total power consumption value for the original data is calculated by multiplying the number of bits, which are different between the original data and the existing data and each have a bit value of SET, by a writing power consumption value of the original data corresponding to the different bits having the bit value of SET, multiplying the number of bits, which are different between the original data and the existing data and each have a bit value of UNSET, by a writing power consumption value of the original data corresponding to the different bits having the bit value of UNSET, and adding the multiplication results.

The total power consumption value for the inverted data is calculated in the same manner as for the total power consumption value for the original data.

For convenience of calculation, writing power values are different from each other according to the bit types of set and reset, and thus the total value of writing power consumption can be easily calculated.

The data write apparatus in a PRAM further includes a data writing unit 306.

The data writing unit 306 chooses the data which has a smaller power consumption between the original data and the inverted data, and store parts of the chosen data which are different those of the existing data in the memory cell 310.

The bit comparing unit 303 compares the read data of n+1 bits respectively with the original data and the inverted data by using a counter, and the power consumption calculating unit 304 calculates the total value of writing power consumption using an adder and a multiplier.

The data writing unit 306 determines which one is smaller between the calculated total value of writing power consumption of the original data and that of the inverted data using a subtracter or comparator.

According to an embodiment, the power comparison can be carried out by using four counters, two multipliers, two adders, and one subtracter (or comparator).

Figure 4:
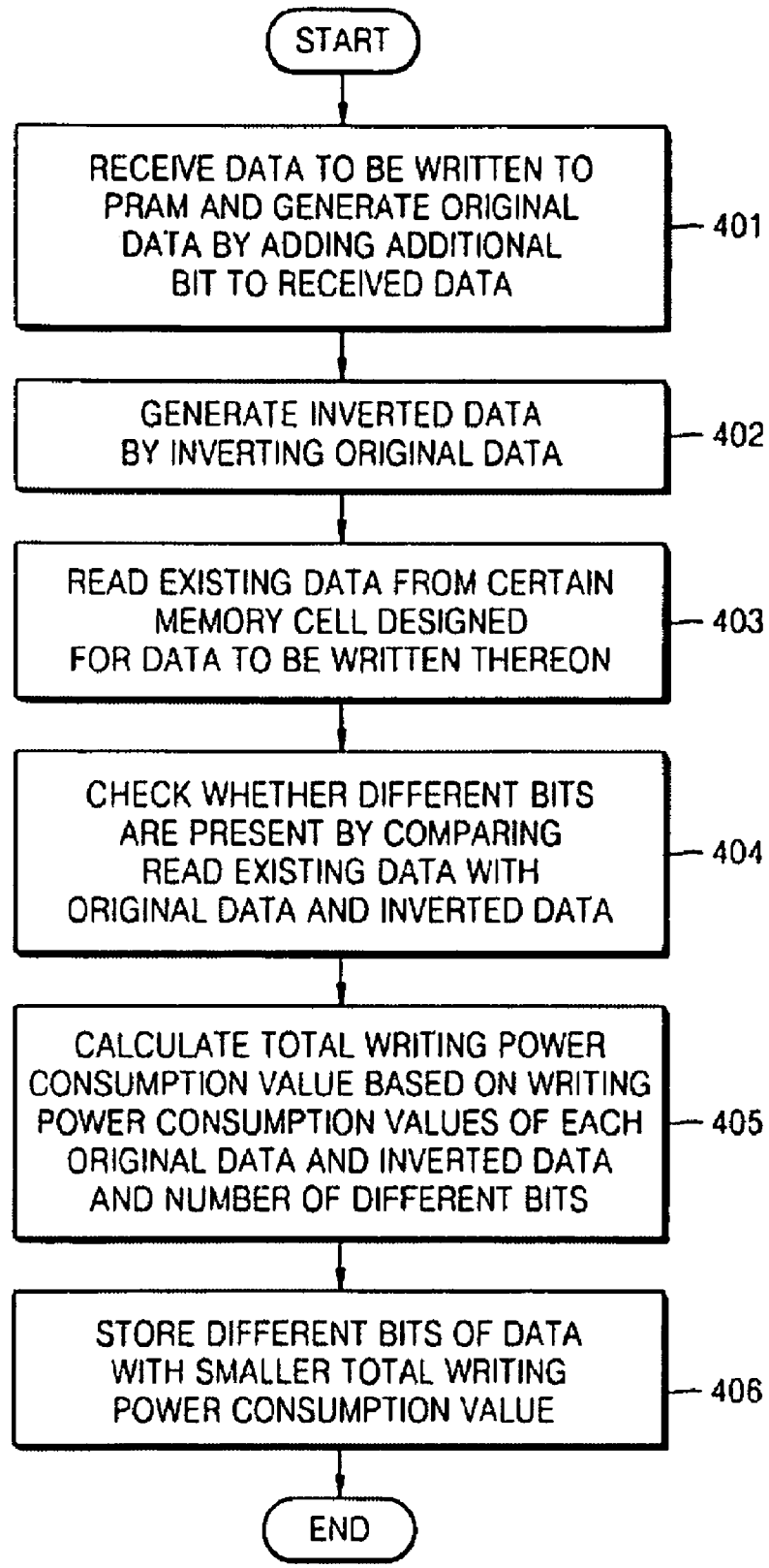
FIG. 4 is a flowchart illustrating a method of writing data in conjunction with data flow, according to an embodiment of the present invention.

FIG. 4 is a flowchart illustrating a method of writing data in conjunction with data flow, according to an embodiment of the present invention.

Referring to FIG. 4, data of n bits is received, which will be written to a memory cell of a PRAM, and original data is generated by adding a bit to the received data (Operation 401), and inverted data is generated by inverting the received data of N bits by the bit (Operation 402). Existing data of n+1 bits is read from the memory cell to which the read data is to be written (Operation 403). In these processes, there is no priority among generating original data, generating inverted data and reading the existing data.

Next, the read data of n+1 bits is respectively compared with the original data and the inverted data to check whether different bits are present, and if they are, it is checked how many different bits are present and which types of bits they are (Operation 404). When there are different bits, respective total values of writing power consumption of the original data and the inverted data are calculated (Operation 405).

The bits of the data which have the smaller total value of writing power consumption, the bits different from the bits of the read data, are stored in the certain memory cell (Operation 406) so that writing process is complete. The types of the different bits include bit values of set and reset.

When the read data of n+1 bits are respectively compared with the original data and the inverted data in Operation 404, the additional bit or the bit inverted from the additional bit is for indicating whether the data is inverted, and thus it is not necessary to compare the bit with the n+1th bit of the read data.

The total value of writing power consumption of the different bits is calculated by adding the values obtained by multiplying the power consumption value corresponding to each bit type by the number of different bits of each bit type.

Figure 5:
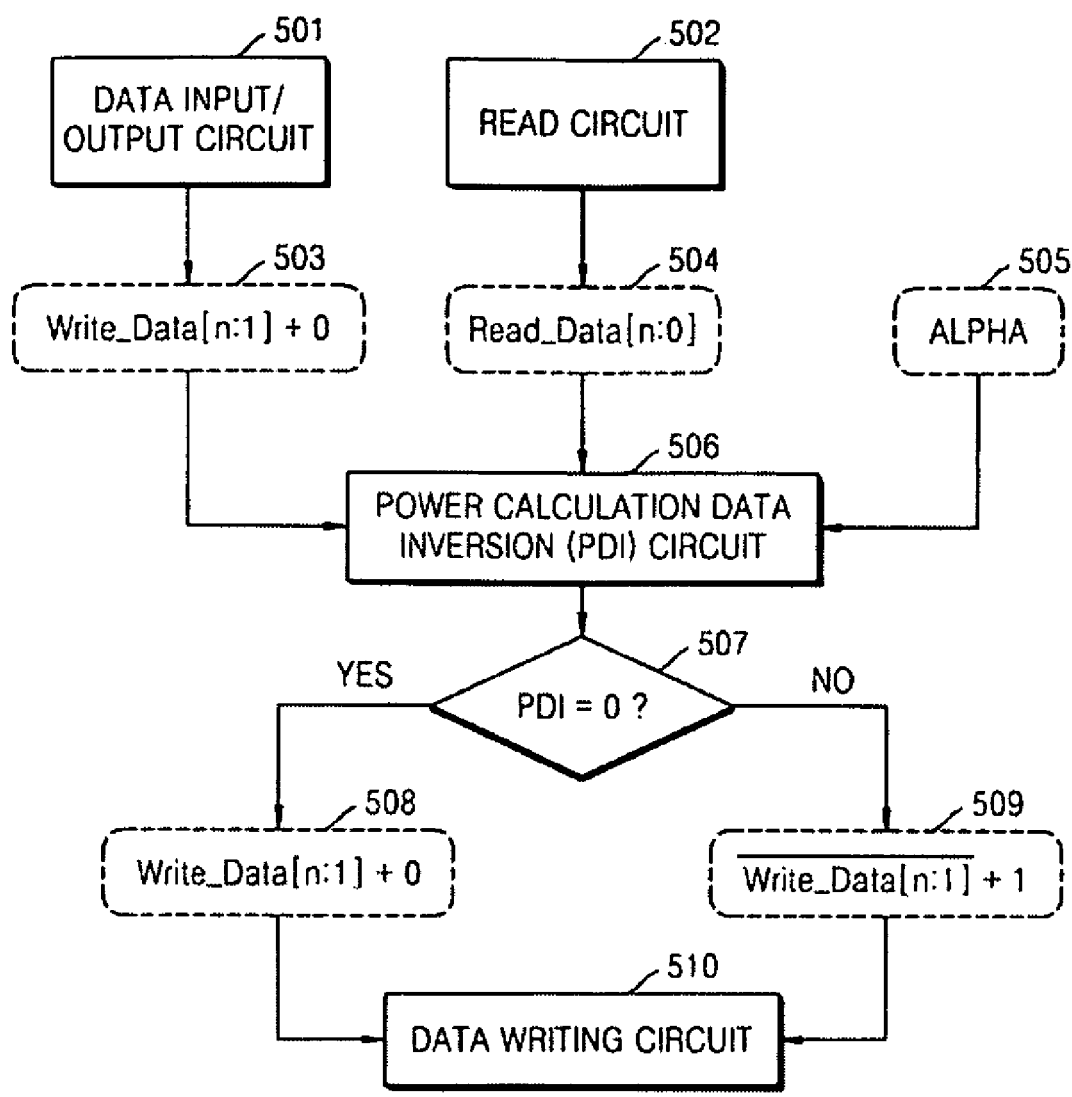
FIG. 5 is a data flow diagram illustrating a method of writing data using a power calculation data inversion (PDI) circuit in a PRAM, according to an embodiment of the present invention.

FIG. 5 is a data flow diagram illustrating a method of writing data using a power calculation data inversion (PDI) circuit 506 to a PRAM, according to an embodiment of the present invention.

Referring to FIG. 5, the data flow diagram shows process procedures in the PRAM having writing power calculating and data inverting functions. Data Write_data[n:1] of n bits is input from a data input/output circuit 501 in order to be written to a memory cell of the PRAM, and data Read_data of n+1 bits is input from a read circuit 502 which reads the data Read_data [n:0] from a position in the memory cell of the PRAM where the data Write_data[n:1] will be written (Operation 504).

As an embodiment of the present invention, n+1 bits are used to store n bits. The additional one bit is for indicating if the data is input intact (in which case, the bit is 0) or if the data is inverted and input (in which case, the bit is 1). Since the additional bit added to the data Write_data[n:1] to be written to the memory cell is not generally inverted, the additional bit is 0 (Operation 503). When the data Write_data[n:1] is inverted, the additional bit is 1.

An alpha value 505 is a ratio of set power consumption $P_{SET}$ to be consumed when 0 is stored in the PRAM to reset power consumption $P_{RESET}$ to be consumed when 1 is stored in the PRAM. That is, alpha=$P_{SET}/P_{RESET}$. Since the set power consumption for storing 0 in the PRAM and reset power consumption for storing 1 in the PRAM are different each other, the alpha value is required to calculate the power consumed in the PRAM.

The PDI circuit 506 calculates the values of the data Write_data[n:1]+0 (Operation 503) to be written, the data Read_data[n:0]+1 (Operation 504) which has been read from a position in the memory cell where the data Write_data[n:1]+0 (Operation 503) will be written, and the alpha, and compares the power consumption when the data Write_data[n:1]+0 (Operation 503) is directly written on the memory with the power consumption when the data Write_data[n:1]+0 (Operation 503) is inverted and written. Then the PDI circuit 506 outputs PDI=0 when the power consumption is smaller if the data Write_data[n:1]+0 (Operation 503) is written intact, or outputs PDI=1 when the power consumption is smaller if the data Write_data[n:1]+0 (Operation 503) is inverted and written (Operation 507).

According to the PDI result, data to be written to the PRAM varies. When PDI=0 (Operation 507), the data Write_data[n:1]+0 is stored (Operation 508), or when PDI=1, the data Write_data[n:1]+1 is stored (509).

When data is stored in the PRAM, a data write circuit 510 compares the read data with the written data by the bit, and writes the data only when the values of bits are different from values of bits to be newly written. The PDI circuit calculates the total value of power consumption in consideration of these procedures.

Figure 6:
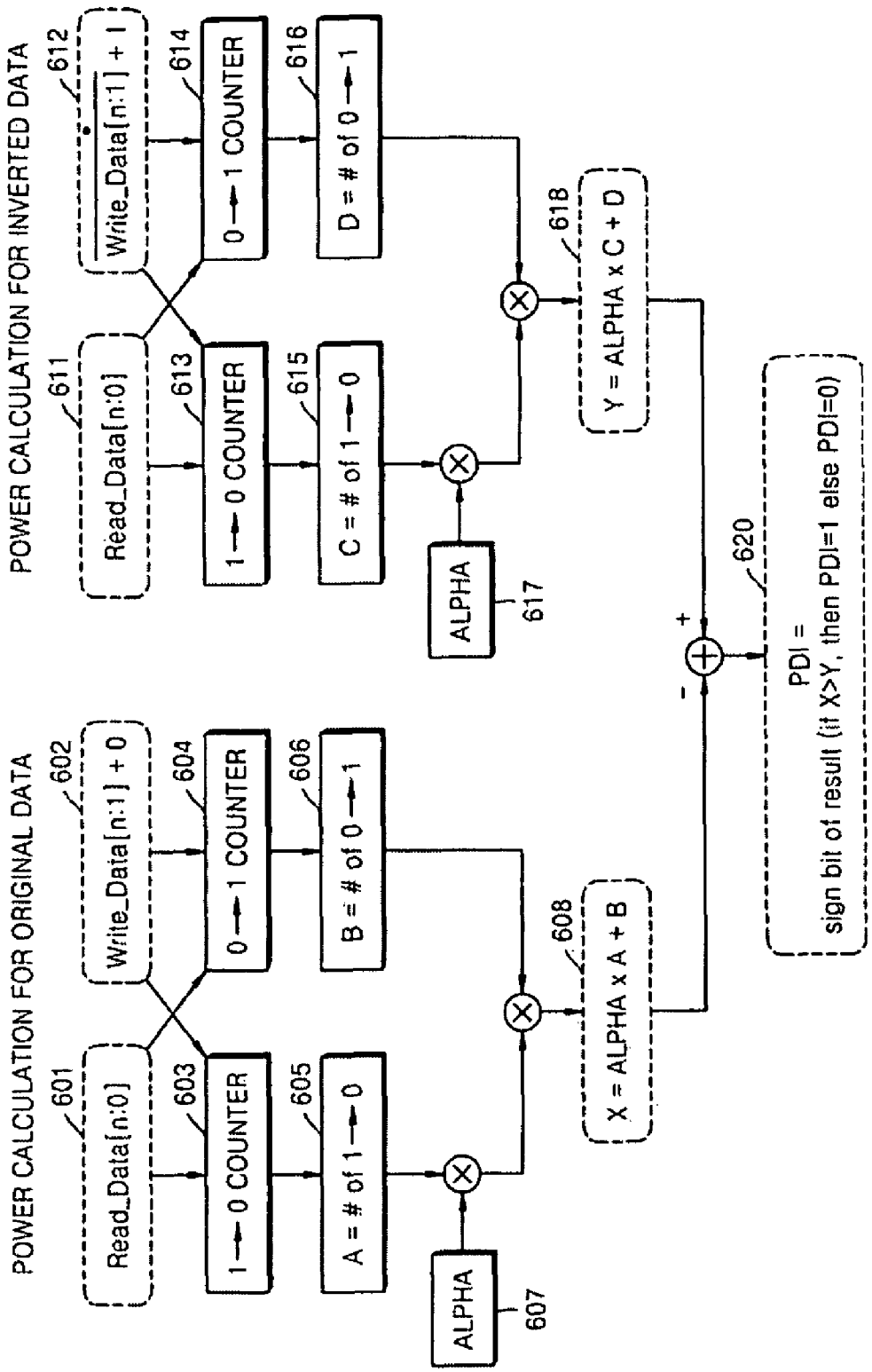
FIG. 6 is a data flow diagram illustrating a method of calculating power consumption for writing data, which is performed by the power calculation inversion (PDI) circuit in FIG. 5.

FIG. 6 is a data flow diagram illustrating a method of calculating power consumption for writing data, which is performed by the power calculation inversion (PDI) circuit in FIG. 5.

The data flow diagram in FIG. 6 is for explaining an embodiment of a PDI circuit. The PDI circuit compares power consumption X for when data is stored intact with power consumption Y for when data is inverted and stored, and outputs the result of PDI=1 (the data is inverted and stored) when X>Y or the result of PDI=0 (the data is stored intact) when X<Y (Operation 620).

When the power consumption X for when the data is stored intact is calculated, the read data Read_data[n:0] (Operation 601) is compared with the data Write_data[n:1]+0 (Operation 602) to be written by the bit. When a read value of each bit and a value to be written are the same as each other, since it is not necessary to store the data again, the power consumption in this case is not calculated.

When the read value of each bit and the value to be written are equal to each other, both the read value and the value to be written are equally either 0 or 1. Alternatively, when the read value is 1 and the value to be written is 0 (1->0), set power $P_{SET}$ for storing 0 is consumed (Operation 603).

When the read value is 0 and the stored value is 1 (0->1), reset power $P_{RESET}$ for storing 1 is consumed (Operation 604). Since the PRAM consumes different power when storing 1 and 0, the alpha value 607 that is a ratio of set power $P_{SET}$ consumption to reset power $P_{RESET}$ consumption (Alpha=$P_{SET}/P_{RESET}$) is required to calculate the power consumed by the PRAM. The PDI circuit is not for calculating the absolute amount of the power consumption, but instead, determines which case consumes the smaller amount of power between when the original data is stored and when the inverted data is stored, and thus does not need to calculate the absolute amount of the power consumption.

Therefore, the power consumption is calculated assuming that the reset power $P_{RESET}$, which is generally smaller, is 1 ($P_{RESET}=1$) and the set power $P_{SET}$ is alpha ($P_{SET}$=Alpha). In order to calculate X, the number A of bits which will be changed from 1 to 0 is obtained (Operation 605), and the number B of bits which will be changed from 0 to 1 is obtained (Operation 606). The total power consumption for setting the bits is obtained by multiplying A by alpha and the total power consumption for resetting the bits is equal to B. Thus, X=alpha×A+B (Operation 608). To obtain X, two counters, one multiplier, and one adder are required. Since the alpha is fixed once a PRAM device is determined, the multipliers used for multiplication can be easily determined.

When the power consumption Y of when the data is inverted and stored is calculated, the read data Read_data[n:0] (Operation 611) is compared with the data Write_data[n:1]+1 (Operation 612) to be written by the bit. The calculating procedures are the same as those for X. First, the number C of bits 613 which will be changed from 1 to 0 (1->0) is obtained, and the number D of bits 614 is obtained (Operation 616). The total power consumption for setting bits is obtained by multiplying C by alpha (Operation 617), and the total power consumption for resetting bits is equal to D. Therefore, Y=alpha×C+D (Operation 618). The devices for calculating Y are the same as those for calculating X.

After calculating X and Y, X and Y are compared to determine which is bigger, and the result of PDI=1 (the data is inverted and stored) is output when X>Y, and the result of PDI=0 (the original data is stored) is output when X<Y (Operation 620). The comparison between X and Y can be performed using the subtracter or the comparator.

For example, if the number of bits of the input data is 8 (n=8), alpha=5, the input data is Write_data[8:1]=00000011, and the read data is Read_data[8:0]=00111110(0), the data to which an additional bit is added and which will be written becomes Write_data[8:1]+0=00000011(0).

In this case, 8 bits is the size of the data to be written and the additional bit (1 bit) is for indicating whether or not the data is inverted. Thus, 9 bits is the total number of bits to be stored.

The writing power consumption of when the input data is stored intact is calculated in the same manner as described above.

When it is assumed that the power consumed when the bit is changed from 0 to 1 is 1, the power consumed when the data is changed from 1 to 0 becomes the alpha. The data Write_data[8:1]+0=0000 0011 (0) which is obtained by adding an additional bit to the original data, that is, the input data and the stored data Read_data[8:0]=0011 1110 (0) are compared with each other to check whether both sets of data have different bits, and the number A of different bits which will be changed from 1 into 0 and the number B of different bits which will be changed from 0 into 1 are achieved.

In this case, A=4, and B=1, and according to the equation, X=alpha×A+B=5×4+1=21. As described above, X is the total power consumption in the case where the input data is stored intact, or in other words, the case where the data which is not inverted is written.

In order to calculate the power consumed when the input data is inverted and stored, inverted data/Write_data[8:1]+1=1111 1100 (1) which is obtained by inverting the input data is compared with data Read_data[8:0]=0011 1110 (0) stored in the memory cell to check if there are different bits present. Next, the number C of different bits which will be changed from 1 into 0 and the number D of different bits which will be changed from 0 into 1 are obtained.

In this case, C=1, D=3, and Y=alpha×C+D=5×1+3=8. Y is the total power consumption in the case of writing the inverted data.

Thus, when X and Y are compared with each other, since X (=21)>Y (=8), the PDI=1, and hence, in this case, it is more efficient to invert and store the data in order to reduce the writing power consumption.

As described above, according to an apparatus and method for writing data to a PRAM by using power consumption calculation and data inversion functions according to the present invention, data is not directly written to the PRAM which consumes a substantial amount of power when storing data, but existing data is read from a memory cell. Then the power consumption values of the original data to be stored and data inverted from the original data are compared to each other, and the data with the smaller power consumption value is stored. Consequently, since the same data is not repeatedly written redundantly, the efficiency of memory writing can be increased and the power consumed for writing data to the PRAM can be significantly reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for writing data to a phase-change random access memory (PRAM) by using writing power calculation and data inversion functions, the apparatus comprising:
   a receiving unit which receives original data to be written to a memory cell of the PRAM;
   a reading unit which reads data existing in the memory cell;
   an original data writing power calculating unit which compares the received original data with the read existing data by the bit and calculates a total power consumption value for writing bits of the original data which are different from those of the existing data, based on a first number of bits of the original data which are different from those of the existing data and have a bit type of SET, a second number of bits of the original data which are different from those of the existing data and have a bit type of RESET, and a power consumption value corresponding to each bit type of the PRAM;
   an inverted data writing power calculating unit which inverts the received original data by the bit, compares the inverted data with the existing data by the bit, and calculates a total power consumption value for writing bits of the inverted data which are different from those of the existing data based on a third number of bits of the inverted data which are different from those of the existing data and have a bit type of SET, a fourth number of bits of the inverted data which are different from those of the existing data and have a bit type of RESET, and the power consumption value corresponding to each bit type of the PRAM; and
   a writing unit which compares the total power consumption value for the original data with the total power consumption value for the inverted data and chooses the data which has a smaller power consumption value between the original data and the inverted data, and stores the chosen data in the memory cell.

2. The apparatus of claim 1, wherein the writing unit stores parts of the chosen data which are different from those of the existing data.

3. The apparatus of claim 1, wherein the power consumption value according to each bit type is a power consumption value for setting or resetting each bit in the PRAM.

4. A method of writing data to a PRAM by using writing power calculation and data inversion functions, the method comprising:
   receiving original data to be written to a memory cell of the PRAM;
   reading existing data from the memory cell;
   calculating a total power consumption value for writing bits of the original data which are different from those of the existing data based on a first number of bits of the original data which are different from those of the existing data and have a bit type of SET, a second number of bits of the original data which are different from those of the existing data and have a bit type of RESET, and a power consumption value corresponding to each bit type of the PRAM after comparing the received original data with the read existing data by the bit;
   inverting the received original data by the bit;
   calculating a total power consumption value for writing bits of the inverted data which are different from those of the existing data based on a third number of bits of the inverted data which are different from those of the existing data and have a bit type of SET, a fourth number of bits of the inverted data which are different from those of the existing data and have a bit type of RESET, and a power consumption value corresponding to each bit type in the PRAM after comparing the inverted data with the existing data by the bit;
   comparing the total power consumption value for the original data with the total power consumption value for the inverted data; and
   choosing the data which has a smaller total power consumption and storing the chosen data in the memory cell.

5. The method of claim 4, wherein in the storing of the chosen data, parts of the chosen data which are different from those of the existing data are stored.

6. The method of claim 4, wherein the power consumption value corresponding to each bit type is a power consumption value for setting or resetting each bit in the PRAM.

7. An apparatus for writing data to a PRAM by using writing power calculation and data inversion functions; the apparatus comprising:
   an original data generating unit which receives data of n bits to be written to a memory cell in the PRAM and generates an original data by adding an additional bit to the received data of n bits;
   an inverted data generating unit which generates inverted data by inverting the generated original data of n+1 bits by the bit;
   an existing data reading unit which reads existing data of n+1 bits from the memory cell;
   a bit comparing unit which compares the read data of n+1 bits respectively with the original data of n+1 bits and the inverted data of n+1 bits by the bit to check whether there are different bits between the read data and the original data and the inverted data, and if so, the bit comparing unit checks types and number of the different bits;

a power consumption calculating unit which calculates respectively each total power consumption value for the original data and the inverted data by using the number of different bits and writing power consumption values respectively corresponding to the types of the different bits when the comparison result shows that there are different bits; and a data writing unit which chooses the data which has a smaller power consumption between the original data and the inverted data, and stores parts of the chosen data which are different from those of the existing data.

8. The apparatus of claim 7, wherein the additional bit of the original data generating unit indicates that the original data is not inverted and differentiates the original data from the inverted data of the inverted data generating unit.

9. The apparatus of claim 7, wherein the types of the different bits include one type which indicates that the bit values of the different bits of the original data or the inverted data is set and the other type which indicates that that the bit values of the different bits of the original data or the inverted data is reset.

10. The apparatus of claim 7, wherein in the power consumption calculating unit, the corresponding writing power consumption value corresponding to the type of the different bits is a relative value, and when there are a plurality of different types of bits of each of the original data and the inverted data, which are different from those of the existing data, the total writing power consumption value is calculated by adding altogether the values respectively obtained by multiplying the number of the same type of the bits of each of the original data and the inverted data, which are different from those of the existing data, by the writing power consumption value corresponding to the type of the bits.

11. The apparatus of claim 10, wherein the bit comparing unit compares the read data of n+1 bits respectively with the original data and the inverted data by using a counter, the power consumption calculating unit calculates the total writing power consumption value by using a multiplier and an adder and the data writing unit determines which data has a smaller total power consumption value by comparing the total writing power consumption value of the original data and the total writing power consumption value of the inverted data by using a subtracter or a comparator.

12. A method of writing data to a PRAM by using writing power calculation and data inversion functions, the method comprising:

receiving data of n bits to be written to a memory cell in the PRAM and generating an original data by adding an additional bit to the received data of n bits;

generating inverted data by inverting the original data of n+1 bits by the bit;

reading existing data of n+1 bits from the memory cell;

comparing the read data of n+1 bits respectively with the original data of n+1 bits and the inverted data of n+1 bits by the bit and checking whether there are different bits between the read data and the original data and the inverted data, and if so, checking types and number of the different bits;

calculating respectively each total power consumption value for the original data and the inverted data by using the number of different bits and writing power consumption values respectively corresponding to the types of the different bits when the comparison result shows that there are different bits; and choosing the data which has a smaller power consumption between the original data and the inverted data, and storing parts of the chosen data which are different from those of the existing data.

13. The method of claim 12, wherein the additional bit indicates that the original data is not inverted and differentiates the original data from the inverted data.

14. The method of claim 12, wherein the types of the different bits include one type which indicates that the bit values of the different bits of the original data or the inverted data is set and the other type which indicates that that the bit values of the different bits of the original data or the inverted data is reset.

15. The method of claim 12, wherein in the calculating of each total power consumption value, the corresponding writing power consumption value corresponding to the type of the different bits is a relative value, and when there are a plurality of different types of bits of each of the original data and the inverted data, which are different from those of the existing data, the total writing power consumption value is calculated by adding altogether the values respectively obtained by multiplying the number of the same type of the bits of each of the original data and the inverted data, which are different from those of the existing data, by the corresponding writing power consumption value corresponding to the type of the bits.

* * * * *